(12) United States Patent
Klein et al.

(10) Patent No.: US 10,204,841 B1
(45) Date of Patent: Feb. 12, 2019

(54) TEMPORARY CONNECTION TRACES FOR WAFER SORT TESTING

(71) Applicant: Xilinx, Inc., San Jose, CA (US)

(72) Inventors: Matthew H. Klein, Redwood City, CA (US); Raghunandan Chaware, Sunnyvale, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/369,545

(22) Filed: Dec. 5, 2016

(51) Int. Cl.
*H01L 23/00* (2006.01)
*H01L 21/66* (2006.01)
*H01L 23/31* (2006.01)
*H01L 21/78* (2006.01)

(52) U.S. Cl.
CPC .............. *H01L 22/32* (2013.01); *H01L 21/78* (2013.01); *H01L 22/14* (2013.01); *H01L 23/3171* (2013.01); *H01L 24/05* (2013.01); *H01L 24/11* (2013.01); *H01L 24/14* (2013.01); *H01L 2224/0401* (2013.01)

(58) Field of Classification Search
CPC ................. H01L 25/0655; H01L 24/36; H01L 24/00–24/98; H01L 25/042; H01L 24/34; H01L 24/35
See application file for complete search history.

(56) References Cited

U.S. PATENT DOCUMENTS

| 7,998,853 | B1* | 8/2011 | Rahman | H01L 21/76898 |
| | | | | 257/E21.499 |
| 8,302,064 | B1* | 10/2012 | Sadoughi | G06F 17/5072 |
| | | | | 716/119 |
| 2007/0063722 | A1* | 3/2007 | Wark | G01R 1/0483 |
| | | | | 324/756.05 |
| 2007/0200572 | A1* | 8/2007 | Breton | G01R 1/07378 |
| | | | | 324/754.03 |
| 2011/0074026 | A1* | 3/2011 | Shim | H01L 21/50 |
| | | | | 257/737 |
| 2017/0062291 | A1* | 3/2017 | Arvin | H01L 22/32 |

* cited by examiner

*Primary Examiner* — Changhyun Yi
(74) *Attorney, Agent, or Firm* — Keith Taboada

(57) ABSTRACT

A method for fabricating integrated circuit (IC) dies and wafers having such dies, are disclosed herein that leverage temporary connection traces during wafer level testing of the functionality of the IC die. In one example, a wafer includes a plurality of IC dies. At least a first IC die of the plurality of IC dies includes a plurality of micro-bumps and a first temporary connection trace formed on an exterior surface of the die body. The plurality of micro-bumps includes at least a first micro-bump and a second micro-bump. The first temporary connection trace electrically couples the first micro-bump and the second micro-bump.

19 Claims, 10 Drawing Sheets

TEMPORARY CONNECTION TRACES FOR WAFER SORT TESTING

TECHNICAL FIELD

Embodiments of the present invention generally relate to integrated chip fabrication and testing, and more particularly to wafer having integrated die containing temporary connection traces for wafer testing prior to dicing, and methods for fabricating the same.

BACKGROUND

Electronic devices, such as tablets, computers, copiers, digital cameras, smart phones, control systems and automated teller machines, among others, often employ electronic components which leverage chip package assemblies having field programmable gate array (FPGA) dies and other integrated circuit (IC) dies for increased functionality and higher component density. As the density and number of solder bump connections in such dies increase, the increased solder bump density presents challenges, particularly for making connections with such high density solder bump connections at wafer testing prior to dicing. For example, probers used for testing dies prior to slicing the wafer into individual dies often have signal integrity issues, particularly at high GHz transmission rates. Additionally, the probers occasionally burn out when sourcing power to low pin count power rails, creating a reliability and maintenance issues.

Therefore, a need exists for improved integrated chip fabrication and testing.

SUMMARY

A method for fabricating integrated circuit (IC) dies and wafers having such dies, are disclosed herein that leverage temporary connection traces during wafer level testing of the functionality of the IC die. In one example, a wafer includes a plurality of IC dies. At least a first IC die of the plurality of IC dies includes a plurality of micro-bumps and a first temporary connection trace formed on an exterior surface of the die body. The plurality of micro-bumps includes at least a first micro-bump and a second micro-bump. The first temporary connection trace electrically couples the first micro-bump and the second micro-bump.

In another example, a method for fabricating an integrated circuit (IC) die is provided. The method includes forming passivation layer over a plurality of bond pads of a first IC die of a plurality of IC dies formed on a wafer, the plurality of bond pads including at least a first bond pad and a second bond pad; forming an under bump metalization layer on the first bond pad and the second bond pad; forming a first micro-bump that is in electrical contact with the first bond pad through a first opening in the passivation layer; forming a second micro-bump that is in electrical contact with the second bond pad through a second opening in the passivation layer; and forming a temporary connection trace coupling the first micro-bump to the second micro-bump.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

A method for fabricating integrated circuit (IC) dies and wafers having such dies, are disclosed herein that leverage temporary connection traces during wafer level testing of the functionality of circuits present in the IC die. For example, temporary connection traces shorted between micro-bumps allow high frequency testing at wafer sort without signal loss, particularly at high GHz transmission rates. Moreover, temporary connection traces can be used to gang micro-bumps used for common voltage and ground signal connections, thus reducing the amount of probers needed on test equipment, while advantageously facilitating delivery of high current through a single prober. The temporary connection traces also can be used access micro-bumps that would normally be hard to access with conventional testing equipment, accordingly enabling testing of circuits that would have been difficult or impossible to be tested using normal testing routines. Thus, the variety of tests that may be performed on the IC die prior to dicing is advantageously increased, which accordingly reduces the cost and testing burden at final testing. As the temporary connection traces are removed prior to wafer dicing, the separated IC dies have no extra connections or circuitry which may reduce reliability of the IC die over its service life. The end result is that the temporary connection traces facilitates pre-dice testing which reduces test time, improves quality and improves product yield of finished packages by culling out defective dies prior to further investment in production resources.

Figure 1:
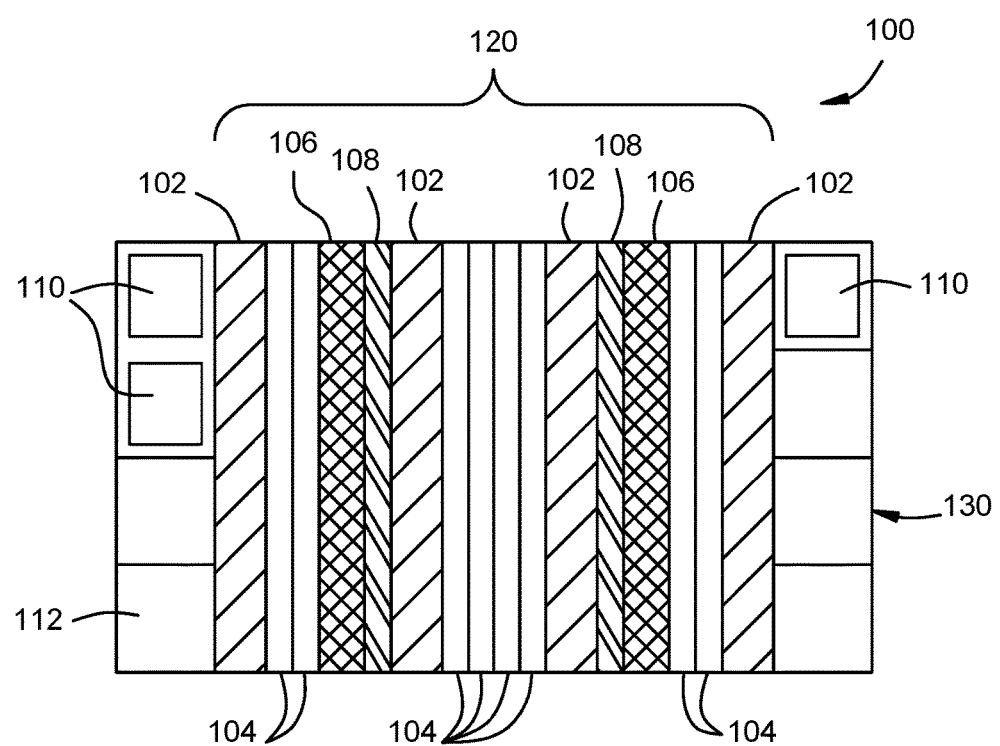
FIG. 1 is a schematic cross-sectional view an integrated circuit (IC) die.

FIG. 1 is a schematic sectional view of integrated circuit (IC) die 100. The functionality of the IC die 100 is provided by solid state circuitry formed in the IC die 100, as further discussed below. The circuitry within the IC die 100 may be configured to perform memory and/or logic functions. The circuitry within the IC die 100 may be configured as an application-specific integrated circuit (ASIC), application-specific standard part (ASSP), system-on-chip (SoC), field programmable gate array (FPGA), memory or other circuit arrangement as desired.

The IC die 100 generally includes a body 130. Although the body 130 may have any suitable shape, the body 130 is shown in an exemplary rectangular form in FIG. 1.

In one embodiment, the IC die 100 is configured as an FPGA die. The circuitry disposed in the body 130 of the FPGA die includes a large number of different programmable tiles 120 including one or more of multi-gigabit transceivers ("MGTs"), configurable logic elements ("CLEs"), random access memory blocks ("BRAMs"), input/output blocks ("IOBs"), configuration and clocking logic ("CONFIG/CLOCKS"), digital signal processing blocks ("DSPs"), specialized input/output blocks ("I/O") (e.g., configuration ports and clock ports), and other programmable logic such as digital clock managers, analog-to-digital converters, system monitoring logic, and so forth. Some FPGA dies also include dedicated processor blocks ("PROC"). Examples of FPGA dies having programmable tiles 120 are available from Xilinx, Inc., of San Jose, Calif., among other manufacturers.

In one example, the programmable tiles 120 of the IC die 100 includes at least one or more distributed configurable logic elements (CLE) tile(s) 104. The CLE tiles 104 are the main resources for implementing general-purpose combinatorial and sequential circuits of the IC die 100. Each CLE tile 104 is made up of the logic elements, which are grouped together in a slice, along with the interconnect routing resources to connect the logic elements. The CLE tiles 104 are arranged in columns throughout the body 130 of the IC dies 100.

Exemplary circuit elements of each CLE tile 104 provides high-performance, low-power programmable logic and may include one or more of logical function generators such as look up tables (LUTs), storage elements, distributed memory and shift register logic (SRL), and multiplexers, and carry logic. The storage elements may include a description of and controls for the latches and flip-flops contained in the CLE tile 104. Dedicated storage elements can be configured as flip-flops or latches with flexible control signals. The carry logic may include dedicated gates that can be cascaded to implement efficient arithmetic functions. The above is just one example of many circuit configurations for a CLE tile that may be utilized with the IC die 100.

The programmable tiles 120 of the IC die 100 may also include at least one or more distributed virtual network on chip (VNoC) tile(s) 102. The VNoC tiles 102 having inputs connected outputs of other tiles, such as the CLE tiles 104, among others, and outputs connected to micro-bumps (discussed further below with reference to FIG. 2) disposed on the outer surface of the die body 130. Similar to the CLE tiles 104, the VNoC tiles 102 are arranged in columns throughout the body 130 of the IC dies 100.

Each VNoC tile 102 comprises switching circuitry and logic that enable routers to route signals from the adjacent tiles (such as CLE tiles) of the IC die 100 to another FPGA die within a chip package assembly. The switching circuitry of the VNoC tiles 102 may include at least one or more of multiplexers, buffers, crossbar switches and arbiters. The above is just one example of many circuit configurations for a VNoC tile may be utilized with the IC die 100.

The programmable tiles 120 of the IC die 100 may also include one or more other tiles generically referred to as miscellaneous tiles 106, 108. The miscellaneous tiles 106, 108 may include one or more of MGT tiles, the random access memory blocks BRAM tiles, IOB tiles, CONFIG/CLOCKS tiles, and DSP tiles. Such miscellaneous tiles 106, 108 are conventionally known. The location of any of the miscellaneous tiles 106, 108 relative to the VNoC tiles 102 and CLE tiles 104 may vary as desired. For example, the relative location of the tiles 120 within the die body 130 shown in FIG. 1 is purely for illustrative purposes, and other locations of one type of tiles relative to another type of tile may be utilized.

The IC die 100 may also include input/output (I/O) blocks 110 and power management controller (PMC) blocks 112, among others. One or both of the I/O and PMC blocks 110, 112 may be located along the periphery of the die body 130.

Figure 7:
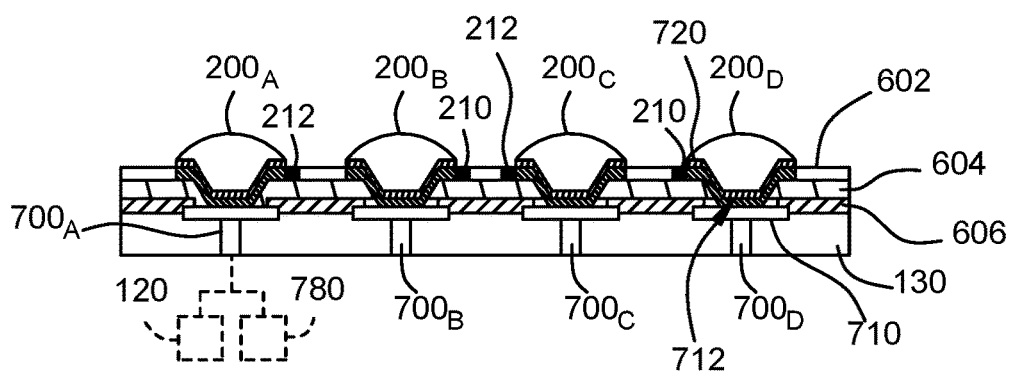
FIG. 7 is a schematic partial cross-sectional view of the IC die of FIG. 5 taken along sectional line 7-7 of FIG. 5.

The circuitry of the IC die 100 may optionally include test circuitry (shown in phantom in FIG. 7 as test circuitry 780). The test circuitry may be utilized to test the functionality of the tiles 120 within the IC die 100.

Figure 2:
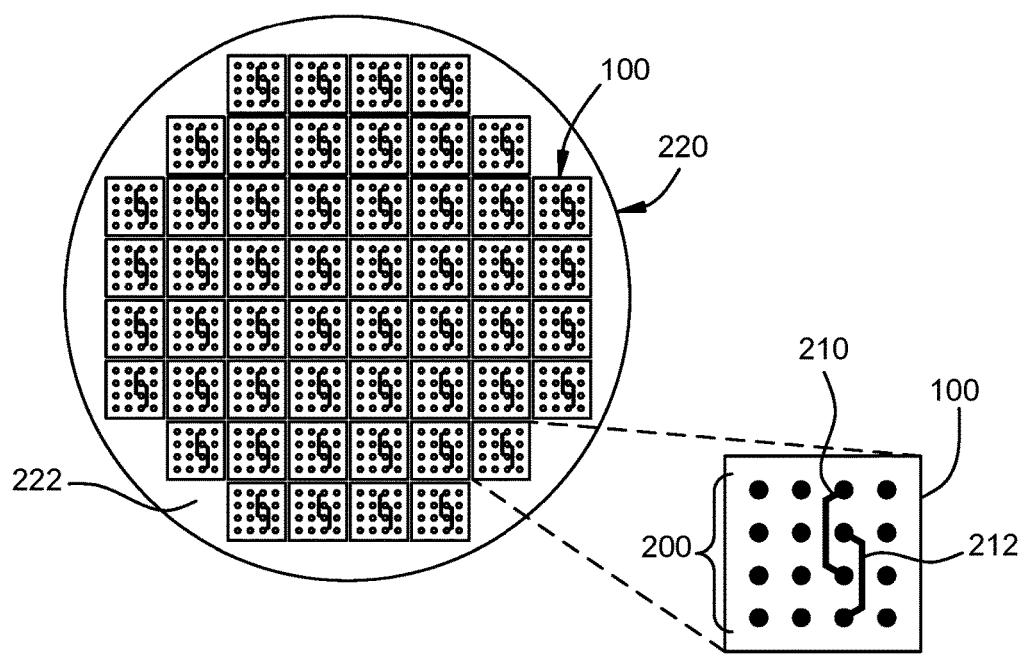
FIG. 2 is a top plan view of a wafer having a plurality of IC dies formed thereon, the IC dies including temporary connection traces suitable for improving wafer sort or other testing of the wafer prior to dicing.

FIG. 2 is a top plan view of a wafer 220 having a plurality of the IC dies 100 formed thereon. The wafer 220 includes a base substrate 222 that may be fabricated from silicon or other suitable material. The substrate 222 may has a diameter of 200 mm, 300 mm, 450 mm or other suitable diameter. One or more of the IC dies 100 have a plurality of micro-bumps 200 that provide the input and output, power, ground and other communicative connections to the programmable tiles 120, I/O and PMC blocks 110, 112 and the like. Although only a few micro-bumps 200 are illustrated in FIG. 2, many more are utilized in actual implementations. In FIG. 2, each IC die 100 is illustrated with only 16 exemplary micro-bumps 200 to avoid overcrowding the illustration, and the 16 micro-bumps 200 are intended to be representative of many additional micro-bumps not shown in FIG. 2.

Two or more of the micro-bumps 200 of at least some of the IC dies 100 are coupled by temporary connection traces. In the example depicted in FIG. 2, two temporary connection traces 210, 212 are shown. The connection traces 210, 212 are formed on an exterior surface of the die body 130, making the traces 210, 212 easily removed after wafer testing. Each of the connection traces 210, 212 couple at least two bond pads upon which the micro-bumps 200 are formed. As discussed above and further detailed below, the temporary connection traces 210, 212 allow improve wafer testing prior to dicing the wafer 220 to separate the FPGA dies.

Figure 3:
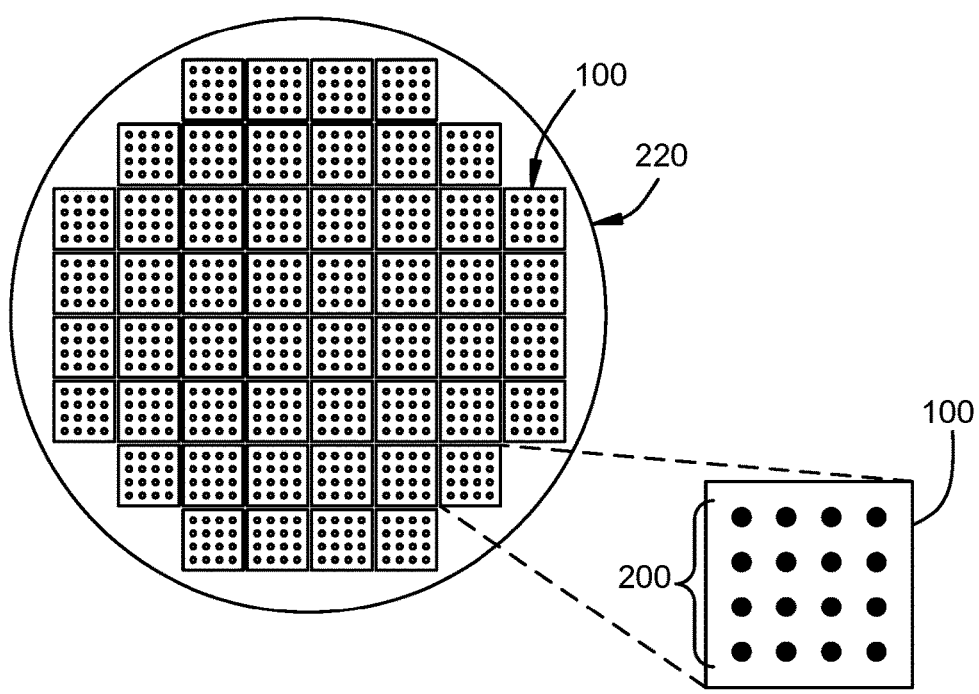
FIG. 3 is a top plan view of the wafer of FIG. 2 illustrating the IC dies with the temporary connection traces removed after testing.
Figure 4:
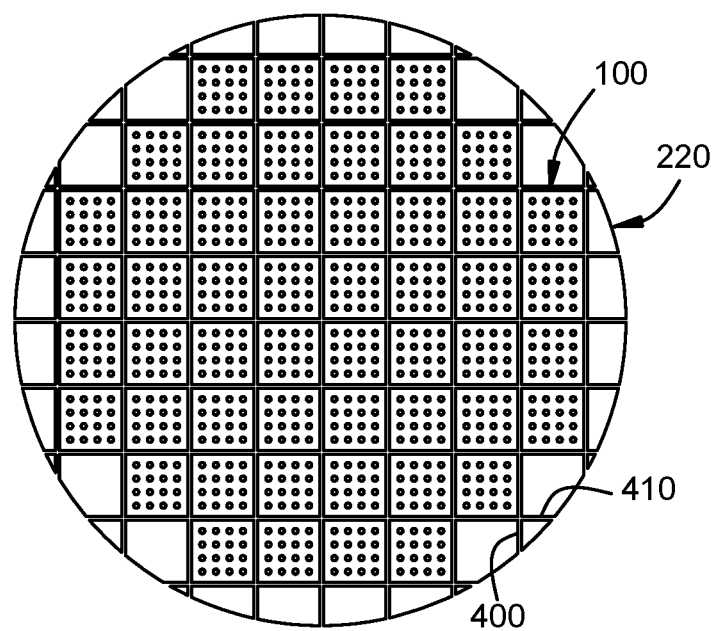
FIG. 4 is a schematic top plan view of the wafer of FIG. 2 illustrating wafer in a diced state with the IC dies read for packaging.

After wafer testing, the temporary connection traces 210, 212 are removed from the IC dies 100 prior to dicing the wafer 220 as illustrated in FIG. 3. FIG. 4 illustrates a schematic top plan view of the wafer 220 in a diced state with the IC dies 100 read for packaging, with the dice lines 400, 410 shown to illustrate the individual separated IC dies 100. As such, the temporary connection traces 210, 212 are not present in the individually separated IC dies 100.

Figure 5:
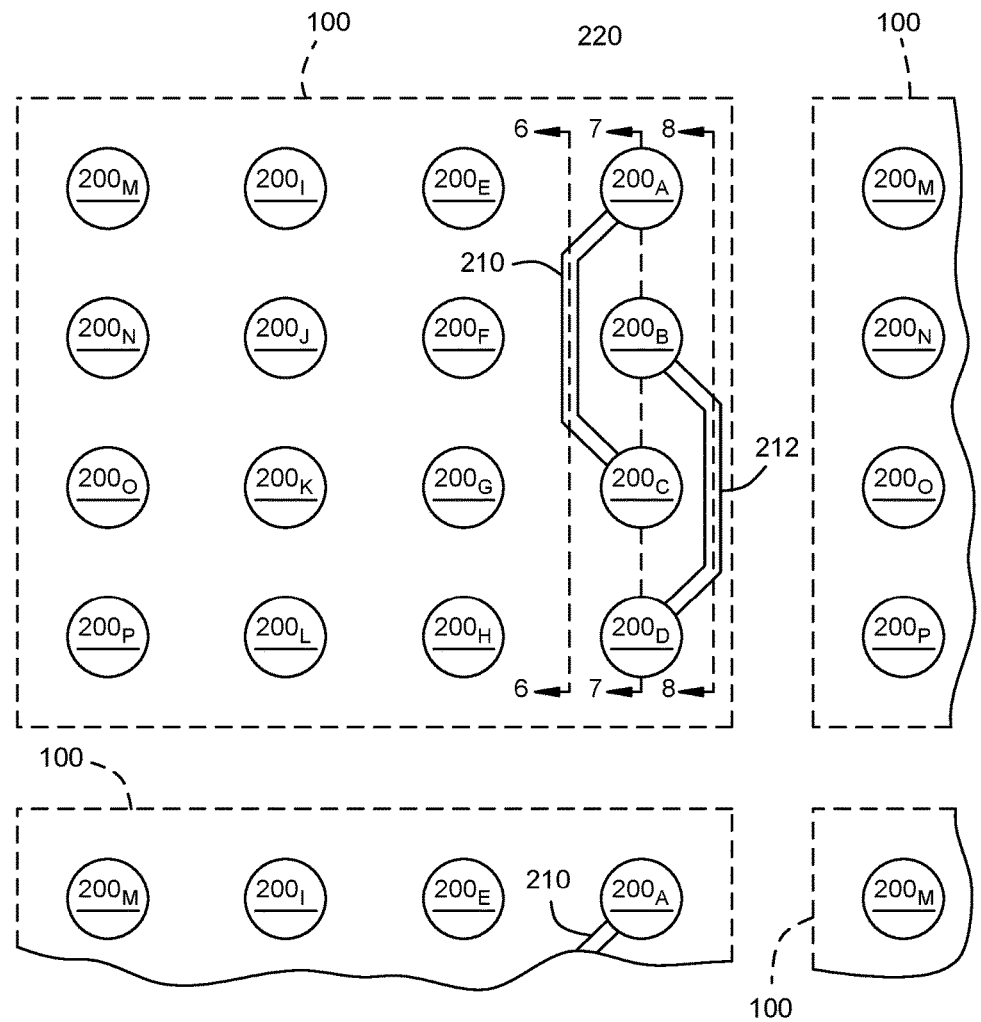
FIG. 5 is a schematic partial bottom view of the wafer of FIG. 1 illustrating selective micro-bumps of the IC die coupled by temporary connection traces.

FIG. 5 is a schematic partial bottom view of the wafer 220 of FIG. 1 illustrating selective micro-bumps 200 of the IC die 100 coupled by at least one temporary connection traces, here exemplarily shown as two temporary connection traces 210, 212. The micro-bumps 200 of the IC die 100 are individually identified using subscripts A-P. The temporary connection trace 210 couples at least two of the micro-bumps 200 of the IC die 100. The second temporary connection trace 212, if utilized, also couples at least two different micro-bumps 200 of the IC die 100. In the example shown in FIG. 5, the temporary connection trace 210 electrically couples the micro-bump 200$_A$ to micro-bump 200$_C$, while temporary connection trace 212 electrically couples the micro-bump 200$_B$ to micro-bump 200$_D$ of the IC die 100. Although the connection traces 210, 212 are shown coupling micro-bumps 200 of the IC die 100 residing in a common column, the connection traces 210, 212 may couple micro-bumps 200 residing in other locations of the IC die 100.

As discussed above, the micro-bumps 200 are coupled to the programmable tiles 120, I/O and PMC blocks 110, 112 and the like of the IC die 100. Thus, by shorting selective micro-bumps 200 using the connection traces 210, 212, wafer sort testable circuitry with the programmable tiles 120 may be efficiently tested.

In one example, a prober contacting one of the micro-bumps 200 coupled by the connection traces 210, 212 may send and/or receive signals for determining a metric indicative of performance of the circuitry residing in the programmable tiles 130 of the FPGA 100.

In one example, high speed transceivers within one or more of the programmable tiles 120 may be tested by connecting the micro-bumps 200 associated with the transmission and receive pads with one of the connection traces 210, 212. For example, the micro-bump 200$_A$ may be coupled by the connection trace 210 to the micro-bump 200$_C$, wherein the micro-bump 200$_A$ is the TX+ input of the transceiver and the micro-bump 200$_C$ is the RX– input of the receiver. Additionally, the micro-bump 200$_B$ may be coupled by the connection trace 212 to the micro-bump 200$_D$, wherein the micro-bump 200$_B$ is the TX– input of the transceiver and the micro-bump 200$_D$ is the RX– input of the receiver. FPGA bit stream signals may be utilized to stimulate high speed sources and receivers to measure response and confirm correctness of test paths with the circuitry of the programmable tile 120. In this manner, the FPGA itself may be configured to perform testing at wafer sort. Testing may be performed at very high (GHz) frequencies with high confidence which cannot be conventionally tested without first placing the IC die 100 in a package and having complex stimulus or printed circuit board (PCB) level traces.

In another example, coupling micro-bump 200$_A$ to micro-bump 200$_C$ using the connection trace 210 enables connections to be made to micro-bumps that would not normally be accessible during wafer sort testing. For example, the micro-bump 200$_A$ and the micro-bump 200$_C$ may be spatially separated by many micro-bumps, and may even reside on opposite sides of the IC die 100.

In another example, the connection trace 210 gangs the micro-bump 200$_A$ with the micro-bump 200$_C$ to enable both micro-bumps 200 to be engaged by a single test probe, thereby reducing the number of probes needed to test the wafer 220. Micro-bumps 200 that may be beneficially ganged include those micro-bumps utilized for power, ground and reference clocks (REFCLKs), transceivers, regular clock input pins, N (negative) inputs of a PN pair, and P (positive) input of a PN pair among others. Additionally, ganging micro-bumps 200 coupled to power rails may reduce arcing to the probe tips while testing.

In another example, the connection trace 210 may be utilized to efficiently loop together digital to analog converters (DAC) and analog to digital converters (ADC) for testing when the DAC and ADC are separated by a substantial distance, which conventionally may make testing impractical if not impossible at the wafer sort stage. For example, the micro-bump 200$_A$ may be coupled to a DAC and the micro-bump 200$_C$ may be coupled to an ADC.

One significant advantage of coupling micro-bumps 200 using connection traces 210, 212 is that the number of probes required test a single IC die 100 at wafer sort may be reduced. Thus, with less probes required test a single IC die 100, multiple IC dies 100 may be tested simultaneously, thereby significantly reducing the cost of testing at wafer sort.

Figure 6:
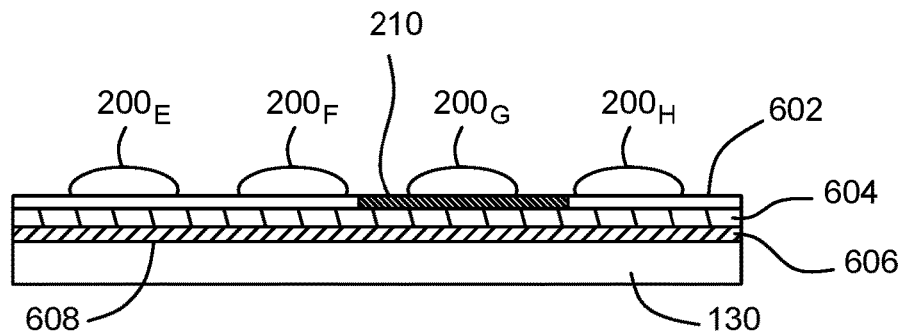
FIG. 6 is a schematic partial cross-sectional view of the IC die of FIG. 5 taken along sectional line 6-6 of FIG. 5.
Figure 8:
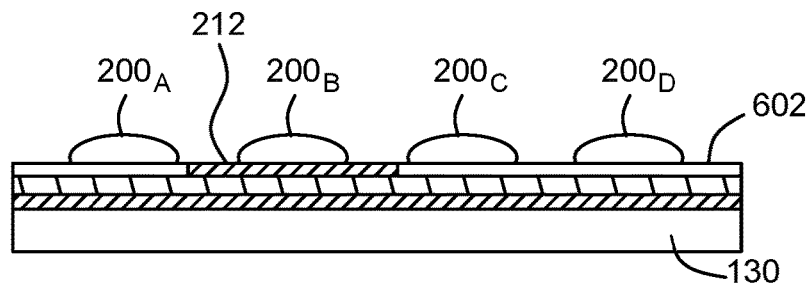
FIG. 8 is a schematic partial cross-sectional view of the IC die of FIG. 5 taken along sectional line 8-8 of FIG. 5.

FIGS. 6-8 are schematic partial cross-sectional views of the FPGA die of FIG. 5 taken along various sectional lines of FIG. 5. The second cross-sectional views illustrate one example of the connection between the micro-bumps 200$_{A-D}$ using connection traces 210, 212. It is contemplated that each connection trace 210, 212 may be utilized to couple any desired the micro-bumps 200 of the IC die 100.

Referring first FIG. 6, FIG. 6 is a schematic partial cross-sectional view of the IC die 100 of FIG. 5 taken along sectional line 6-6 of FIG. 5. The IC die 100 includes a passivation layer 606 disposed on an exterior surface 608 of the die body 130. A dielectric layer 604 is disposed on the passivation layer 606, and a top dielectric layer 602 is disposed on the dielectric layer 604. The passivation layer 606 may be SiN or other suitable material. The dielectric layer 604 may be polyimide or other suitable material, while the top dielectric layer 602 may be a high temperature polymer or other suitable material. In the sectional view of FIG. 6, the connection trace 210 is shown disposed on the dielectric layer 604, and may have the same or similar thickness as the top dielectric layer 602. The connection trace 210 is separated from the exterior surface of the die body 130 by the passivation layer 606. The micro-bumps 200$_E$, 200$_F$, 200$_G$ and 200$_H$ can be seen in the background.

FIG. 7 is a schematic partial cross-sectional view of the IC die 100 of FIG. 5 taken along sectional line 7-7 of FIG. 5. The micro-bumps 200$_A$, 200$_B$, 200$_C$ and 200$_D$ are in cross-section and are disposed on a seed layer 720. The seed layer 720 is a metal layer that provides good electrical and mechanical connection with the micro-bumps 200. In one example, the seed layer 720 is fabricated from Cu, Ni or other suitable metal. The seed layer 720 may be deposited by printing, plating or other suitable metal deposition technique.

An under bump metalization (UBM) layer 712 is disposed on the seed layer 720. The UBM layer 712 may be fabricated from one or more metal layers, and may include adhesion layer and the like. The UBM layer 712 may include one or more layers of Ni, Cu, Ti, Al or other suitable metal.

The UBM layer 712 is formed in an opening in the dielectric layers 602, 604. The UBM layers 712 are in contact with bond pads 710$_A$, 710$_B$, 710$_C$ and 710$_D$ formed on the die body 130 through the opening in the dielectric layers 602, 604. The bond pads 710$_{A-D}$ may be formed from Al or other suitable material. The bond pads 710$_{A-D}$ are coupled to the programmable tiles 120, I/O and PMC blocks 110, 112, optional test circuitry 780, and the like through circuit traces 700$_{A-D}$.

The test circuitry 780, when present, is generally used during testing prior to wafer dicing, for example during wafer sort testing. The test circuitry 780 enables a stimulus or capture of functional elements of the circuitry of the IC die 100, such as the tiles 120, under test. The test circuitry 780 does not necessarily have to provide a function in the finished IC die 100, and may be solely for pre-dice testing. The test circuitry 780 may include passive components such as resistors, capacitors, or inductors. For example, the test circuitry 780 may include capacitors in series with an output connected to an input because common mode voltage needs of the source and destination are different (such as DAC vs ADC). Additionally, the test circuitry 780 may include oscillators or other active circuits connected as a stimulus or needed signal for a block under test as opposed to having an input switch selecting between the on-die test source and input pad going to the receiver, which would cause added jitter in the normal mode. The test circuitry 780 may also be a capture circuit temporarily connected to a source that would otherwise provide an unwanted load when the output or source performs its designed function.

Continuing to refer to FIG. 7, the surface of the die body 130 and a portion of the top surface of the bond pads $710_{A-D}$ are covered by the passivation layer 606. The passivation layer 606 has openings that allow contact between the bond pads $710_{A-D}$ and the UBM layer 712. The passivation layer 606 may be formed from SiN or other suitable dielectric materials.

The temporary connection traces 210, 212 are formed on the dielectric layer 604. The temporary connection traces 210, 212 are formed form an electrically conductive material, such as a metal, and in one example, is formed from the same material as the UBM layer 712 or the seed layer 720. The temporary connection traces 210, 212 may also be formed simultaneously with the UBM layer 712 or the seed layer 720. For example, the traces 210, 212 and the UBM layer 712 or the seed layer 720 may be plated as a single layer of material.

In some examples, the UBM layer 712 may be directly in contact with the micro-bumps 200 without the presence of a seed layer 720. In such examples, the temporary connection traces 210, 212 are formed directly on the UBM layer 712. The temporary connection traces 210, 212 may be formed simultaneously with the UBM layer 712, for example, by printing, plated or otherwise depositing the UBM layer 712 and the traces 210, 212 as a single layer of material.

As illustrated in the sectional view of FIG. 7, one end of the temporary connection trace 212 is coupled to the UBM layer 712 or the seed layer 720 for supporting the micro-bump $200_A$, while the other end of the temporary connection trace 212 is coupled to the UBM layer 712 supporting the micro-bump $200_C$. Also as illustrated in the sectional view of FIG. 7, one end of the temporary connection trace 210 is coupled to the UBM layer 712 supporting the micro-bump $200_B$, while the other end of the temporary connection trace 210 is coupled to the UBM layer 712 supporting the micro-bump $200_D$. Although the temporary connection traces 210, 212 are spaced apart to prevent shorting, the top dielectric layer 602 provides an extra measure of electrical insulation between the traces 210, 212.

FIG. 8 is a schematic partial cross-sectional view of the IC die 100 of FIG. 5 taken along sectional line 8-8 of FIG. 5. In the sectional view of FIG. 6, the connection trace 212 is shown disposed on the dielectric layer 604 in an opening between the top dielectric layer 602. The micro-bumps $200_A$, $200_B$, $200_C$ and $200_D$ are shown in the background.

Although only two micro-bumps 200 are shown coupled by traces 210, 212 in FIGS. 5-8 discussed above, one or more of the traces 210, 212 may connect more than two micro-bumps 200 of a single IC die 100. Connecting more than two micro-bumps 200 may be advantageous when sharing differential REFCLK clocks, power connections, ground or other signals that can be shared utilizing a common input (i.e., via a prober) to a plurality of micro-bumps 200 during testing prior to wafer dicing.

Figure 9:
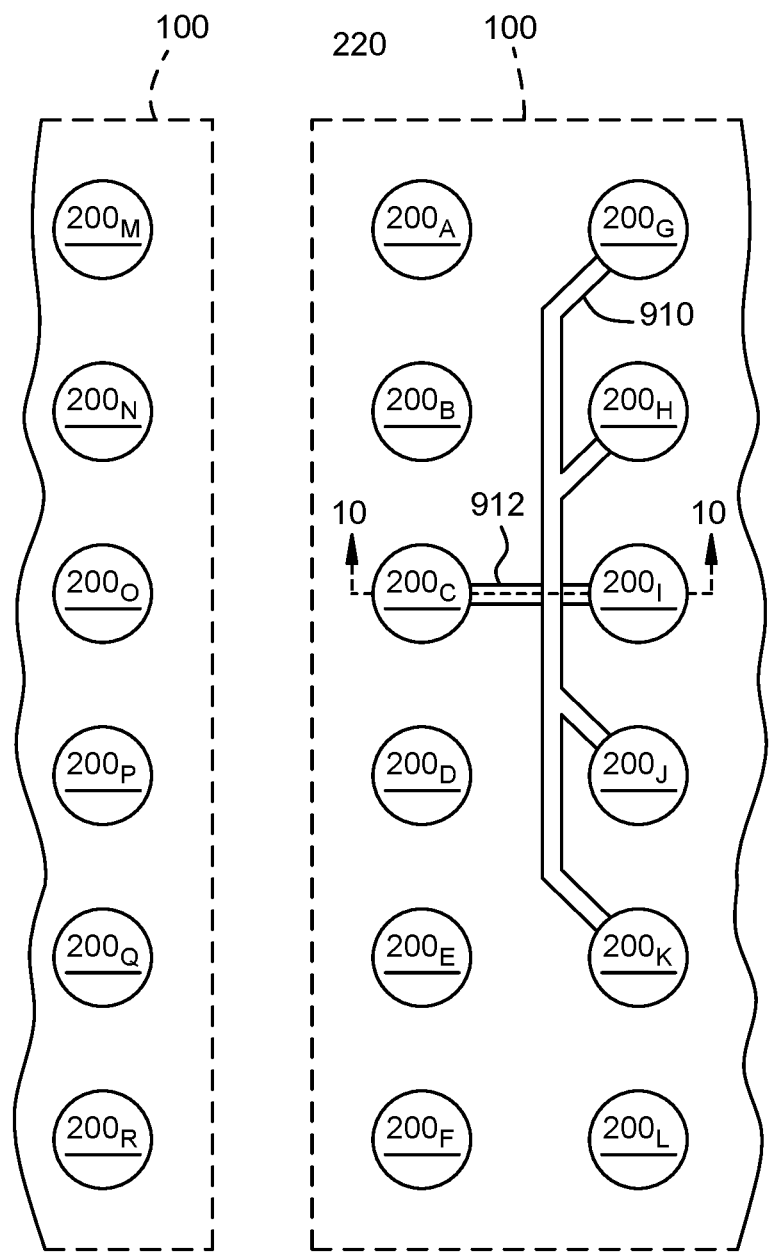
FIG. 9 is a schematic partial bottom view of a wafer having a plurality of IC dies formed thereon illustrating selective micro-bumps of one IC die coupled by temporary connection traces.

FIG. 9 is a schematic partial bottom view of a wafer 220 having a plurality of IC dies 100 formed thereon illustrating selective micro-bumps 200 of one IC die 100 coupled by temporary connection traces 910, 912. The micro-bumps 200 of the IC die 100 are individually identified by subscripts A through M. Micro-bumps $200_G$, $200_H$, $200_J$, and $200_K$ are ganged together by the temporary connection trace 910. Micro-bumps $200_C$ and $200_I$ are ganged together by the temporary connection trace 912. The connection traces 910, 912 are configured in an arrangement that prevents shorting between the traces 910, 912. Shorting may be prevented through the use of conductive jumpers or forming the traces 910, 912 on separate layers stacked on the dielectric layer 604.

Figure 10:
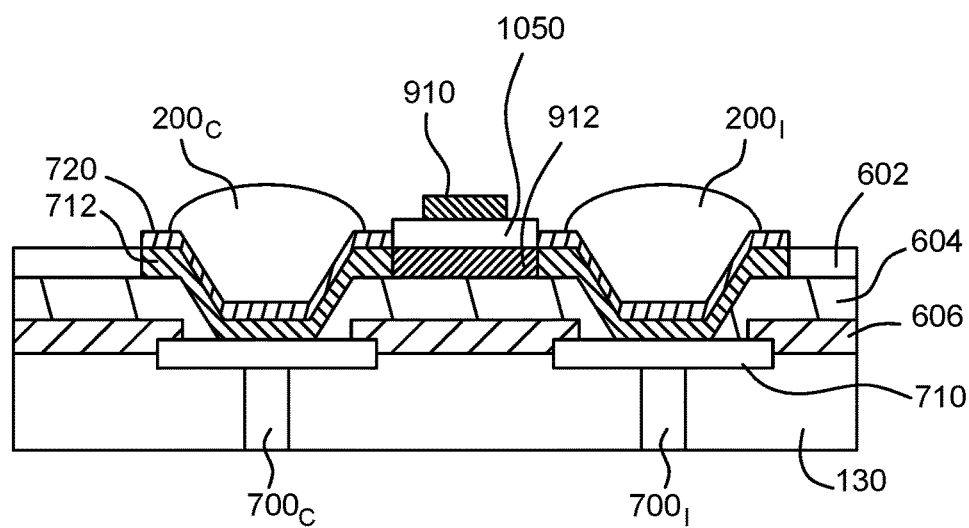
FIG. 10 is a schematic partial cross-sectional view of the IC die of FIG. 9 taken along sectional line 10-10 of FIG. 9.

One example of traces 910, 912 formed on separate layers stacked on the dielectric layer 604 is illustrated in the schematic partial cross-sectional view of FIG. 10 taken along sectional line 10-10 of FIG. 9. As illustrated in FIG. 10, the temporary connection trace 912 coupling the micro-bumps $200_C$ and $200_I$ is formed directly on the dielectric layer 604. The temporary connection trace 912 may be formed simultaneously with the UBM layer 712 or seed layer 720. The micro-bumps $200_C$ and $200_I$ are coupled through the seed layers 720, UBM layers 712 and bond pads 710 to circuit traces $700_C$, $700_I$.

The temporary connection trace 910 coupling micro-bumps $200_G$, $200_H$, $200_J$, and $200_K$ is disposed on a layer different than a layer on which the temporary connection trace 912 are deposited. For example, a dielectric separation layer 1050 may be formed on the temporary connection trace 912 to electrically insulate the temporary connection trace 910 formed on the dielectric separation layer 1050 from the temporary connection trace 912, thereby allowing the temporary connection trace 910 to be routed vertically over the temporary connection trace 912 (relative to the die body 130). The dielectric separation layer 1050 may be removed with the temporary connection traces 910, 912 after wafer testing. Although only three layers (910, 912, 1050) are shown forming an interconnect layer stack selectively coupling the micro-bumps 200, interconnect layer stacks having additional layers may be utilized to provide a more complex connection trace routing between selective micro-bumps 200.

Figure 11:
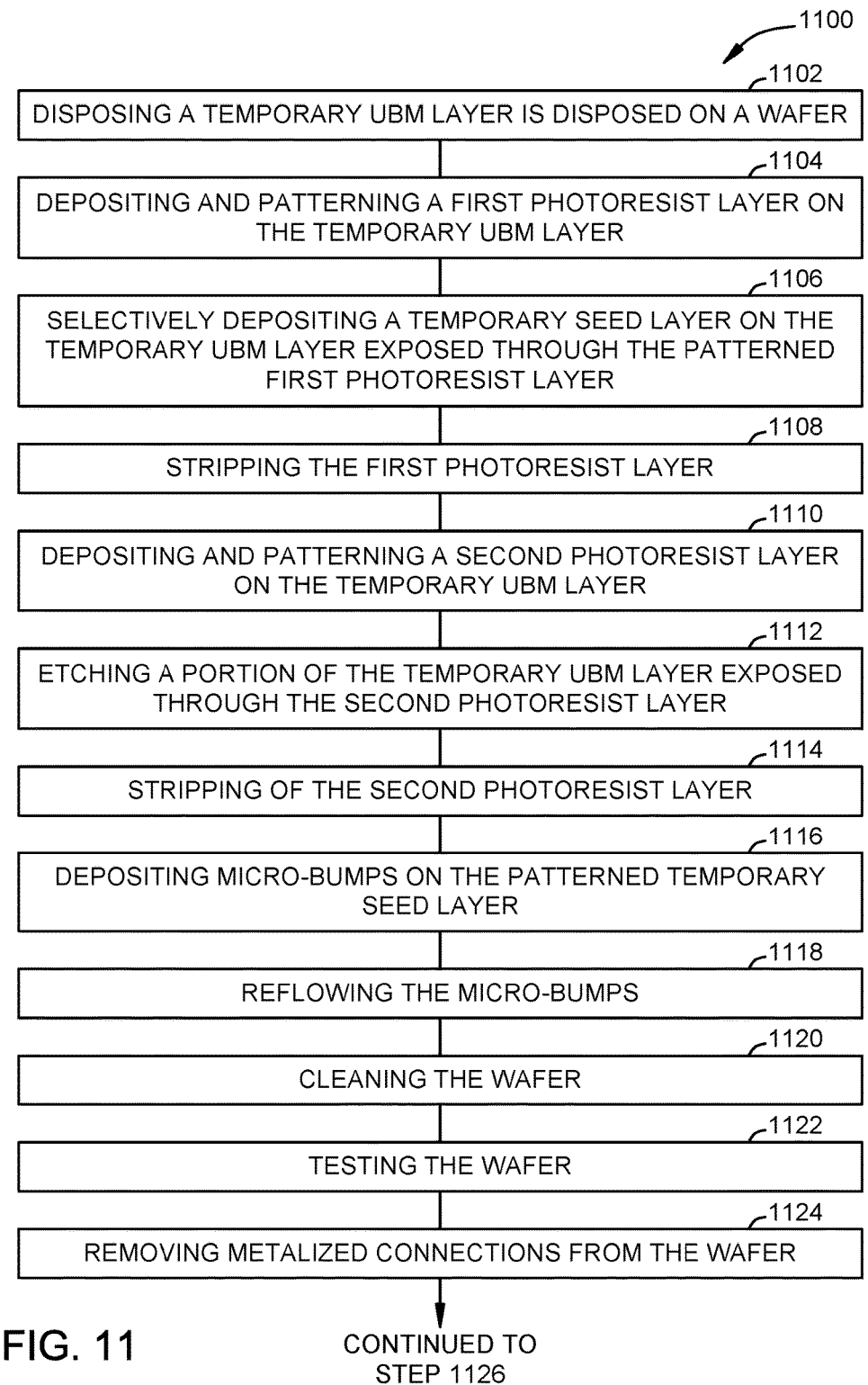
FIG. 11 is method for fabricating a IC dies having temporary connection traces.
Figure 11:
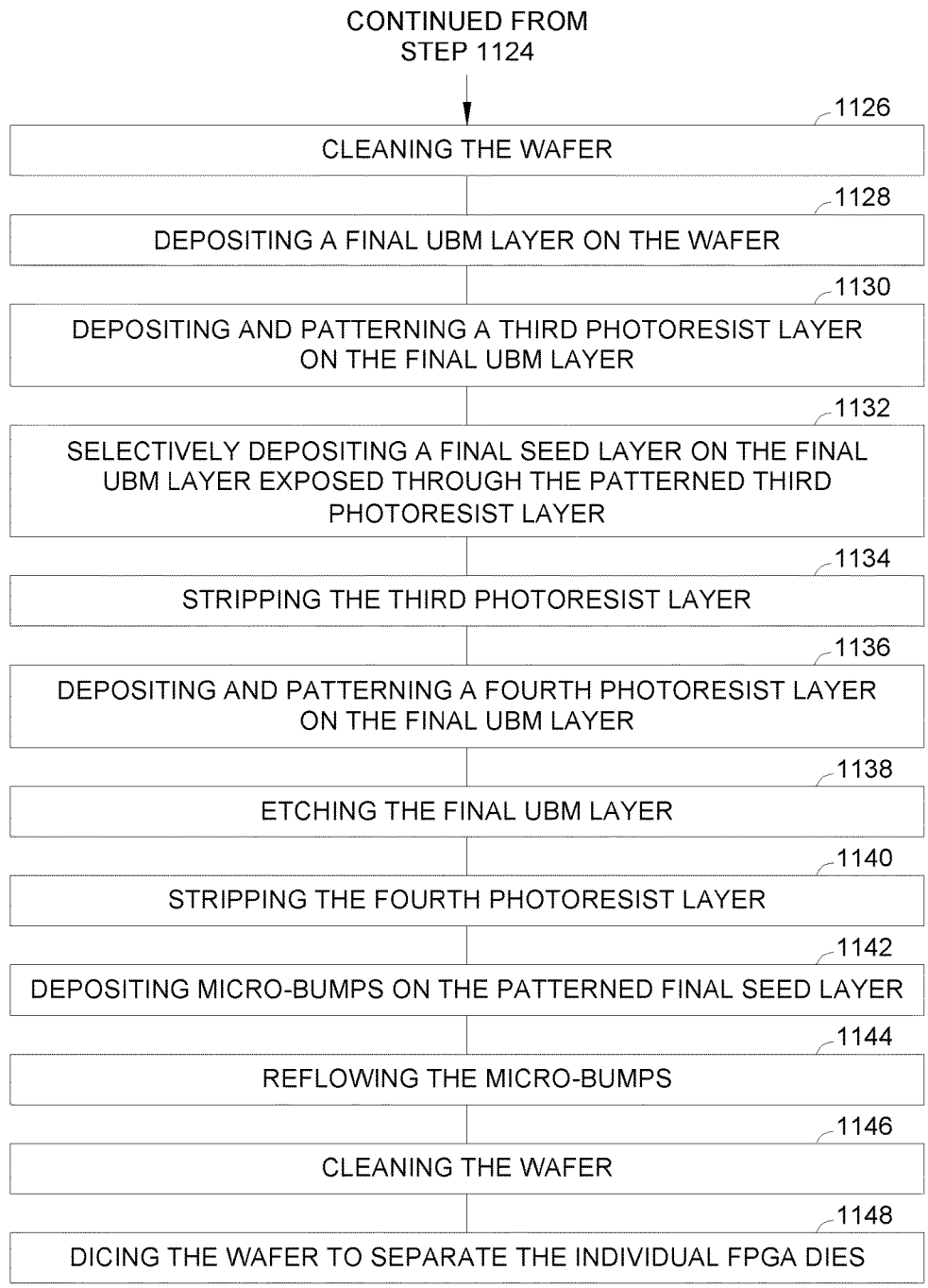

FIG. 11 is method 1100 for fabricating a FPGA dies having temporary connection traces. The method 1100 begins at operation 1102 wherein a temporary UBM layer is disposed on the wafer. The temporary UBM layer may be deposited utilizing sputter deposition or other suitable deposition technique to from one or more metal layers. The one or more metal layers comprising the temporary UBM layer may include one or more layers of Ni, Cu, Ti, Al or other suitable metal.

At operation 1104, a first photoresist layer is deposited and patterned over the temporary UBM layer, for example, utilizing conventional photolithography processes. The patterned first photoresist layer is utilized to selectively deposit a temporary seed layer on the temporary UBM layer exposed through the patterned first photoresist layer at operation 1106. The temporary connection traces may be formed contemporaneously with the formation of the temporary UBM or temporary seed layer at either operation 1104, 1106. In one example, the temporary connection traces are plated with the seed layer as a single layer.

At operation 1108, the first photoresist layer is stripped. Once the first photoresist layer has been stripped, a second photoresist layer is deposited and patterned over the temporary UBM layer at operation 1110. The second photoresist layer shields the temporary connection traces and temporary seed layer residing over portions of the temporary UBM layer. The portion of the temporary UBM layer exposed through the second photoresist layer is etched at operation 1112, followed by stripping of the second photoresist layer at operation 1114.

Micro-bumps are deposited on the patterned temporary seed layer at operation 1116 and the micro-bumps reflowed at operation 1118. The wafer is cleaned at operation 1120 and ready for testing as shown as shown in FIG. 2.

Wafer sort or other testing is then performed on the cleaned wafer at operation 1122. During wafer testing, advantage is taken of the temporary connection traces to more efficiently test the wafer. For example, probers of a test system may apply a common signal to one micro-bump that is shorted to one or more other micro-bumps through one more temporary connection traces. Wafer testing may include testing a continuity of a circuit path within an FPGA die disposed on the wafer, providing an FPGA bit stream signal to stimulate high speed sources and receivers, and providing a common clock signal to multiple micro-bumps coupled by a temporary connection trace, among others.

After completion of wafer testing, metalized connections, i.e., the micro-bumps, temporary connection traces, temporary seed layers and temporary UBM layers, are removed at operation 1124. The metalized connections may be removed by wet etching, dry etching or other suitable technique. After the temporary connection traces are removed, the wafer is removed is cleaned at operation 1126 to prepare the wafer for final micro-bump formation and dicing.

Once example of a sequence for final micro-bump formation and dicing begins at operation 1128 by depositing a final UBM layer on the wafer. The final UBM layer may be deposited using the techniques described above with reference to the temporary UBM layer.

At operation 1130, a third photoresist layer is deposited and patterned over the final UBM layer. The patterned third photoresist layer is utilized to selectively deposit a final seed layer on the final UBM layer exposed through the patterned third photoresist layer at operation 1132. The final seed layer may be deposited using the techniques described above with reference to the temporary seed layer.

At operation 1134, the third photoresist layer is stripped. Once the third photoresist layer has been stripped, a fourth photoresist layer is deposited and patterned over the final UBM layer at operation 1136 for etching the final UBM layer at operation 1138, followed by stripping of the fourth photoresist layer at operation 1140.

Micro-bumps are deposited on the patterned final seed layer at operation 1142 and the micro-bumps reflowed at operation 1144. The wafer is cleaned at operation 1146 and diced at operation 1148 to separate the individual IC dies 100 as shown in FIG. 4.

Thus, a method for fabricating field programmable gate array (FPGA) dies and wafers having such dies have been disclosed that leverages the use of temporary connection traces during wafer level testing of the functionality of FPGA dies. The temporary connection traces shorted between micro-bumps allow high frequency testing at wafer sort without signal loss, particularly at high GHz transmission rates, and can be used to gang micro-bumps used for common signal connections, thus reducing the amount of probers needed on test equipment. Advantageously, the use of temporary connection traces increases the variety of tests that may be performed on the FPGA die prior to dicing, which accordingly reduces the cost and testing burden at final testing. Since the temporary connection traces are removed prior to wafer dicing, the diced FPGA die have no extra connections or circuitry which may reduce reliability of the FPGA die over its service life.

While the foregoing is directed to embodiments of the present invention, other and further embodiments of the invention may be devised without departing from the basic scope thereof, and the scope thereof is determined by the claims that follow.

What is claimed is:

1. A method for fabricating integrated circuit chip (IC die), the method comprising:
   forming passivation layer over a plurality of bond pads of a first IC die of a plurality of IC dies formed on a wafer, the plurality of bond pads including at least a first bond pad and a second bond pad;
   forming an under bump metalization layer on the first bond pad and the second bond pad;
   forming a first micro-bump on the wafer that is in electrical contact with the first bond pad through a first opening in the passivation layer;
   forming a second micro-bump on the wafer that is in electrical contact with the second bond pad through a second opening in the passivation layer;
   forming a temporary connection trace on the wafer coupling the first micro-bump to the second micro-bump;
   removing the first and second micro-bumps;
   forming a first final micro-bump on the first bond pad; and
   forming a second final micro-bump on the second bond pad.

2. The method of claim 1, wherein forming the temporary connection trace comprises:
   contemporaneously depositing the temporary connection trace and the under bump metalization layer.

3. The method of claim 1, wherein forming the temporary connection trace comprises:
   contemporaneously depositing a metal layer on the under bump metalization layer with the temporary connection trace.

4. The method of claim 3, wherein depositing the metal layer comprises:
   depositing a seed layer on the under bump metalization layer.

5. The method of claim 1 further comprising:
   contacting the first micro-bump with a prober of a test system; and
   testing circuitry of the first IC die coupled to the first micro-bump.

6. The method of claim 1 further comprising:
   testing the first IC die while on the wafer; and
   removing the temporary connection trace coupling the first micro-bump to the second micro-bump after testing.

7. The method of claim 6, wherein testing the first IC die further comprises:
   applying power to the first micro-bump and the second micro-bump through a single prober.

8. The method of claim 6, wherein testing the first IC die further comprises:
   determining a metric indicative of performance of circuitry disposed within the first IC die that is coupled to the first micro-bump.

9. The method of claim 6 further comprising:
   dicing the wafer to individually separate the plurality of IC dies.

10. The method of claim 1 further comprising:
    contacting the first micro-bump with a prober of a test system; and testing circuitry of the first IC die coupled to the first micro-bump.

11. The method of claim 1 further comprising:
testing the first IC die while on the wafer; and
removing the temporary connection trace coupling the first micro-bump to the second micro-bump after testing.

12. The method of claim 11, wherein testing the first IC die further comprises:
applying power to the first micro-bump and the second micro-bump through a single prober.

13. The method of claim 11, wherein testing the first IC die further comprises:
determining a metric indicative of performance of circuitry disposed within the first IC die that is coupled to the first micro-bump.

14. The method of claim 11 further comprising:
dicing the wafer to individually separate the plurality of IC dies.

15. The method of claim 1 further comprising:
removing the under bump metalization layer from the first bond pad and the second bond pad prior to forming the final micro-bumps; and
depositing a final bump metalization layer from the first bond pad and the second bond pad prior to forming the final micro-bumps.

16. The method of claim 15, wherein removing the under bump metalization layer from the first bond pad and the second bond pad prior to forming the final micro-bumps occurs contemporaneously with removing the temporary connection trace.

17. A method for fabricating integrated circuit chip (IC die), the method comprising:
forming passivation layer over a plurality of bond pads of a first IC die of a plurality of IC dies formed on a wafer, the plurality of bond pads including at least a first bond pad and a second bond pad;
forming an under bump metalization layer on the first bond pad and the second bond pad;
forming a first micro-bump that is in electrical contact with the first bond pad through a first opening in the passivation layer;
forming a second micro-bump that is in electrical contact with the second bond pad through a second opening in the passivation layer; and
forming a temporary connection trace coupling the first micro-bump to the second micro-bump, wherein forming the temporary connection trace comprises:
contemporaneously depositing the temporary connection trace and the under bump metalization layer; or
contemporaneously depositing a metal layer on the under bump metalization layer with the temporary connection trace;
removing the first and second micro-bumps;
forming a first final micro-bump on the first bond pad; and
forming a second final micro-bump on the second bond pad.

18. The method of claim 17, wherein removing the under bump metalization layer from the first bond pad and the second bond pad prior to forming the final micro-bumps occurs contemporaneously with removing the temporary connection trace.

19. A method for fabricating integrated circuit chip (IC die), the method comprising:
forming passivation layer over a plurality of bond pads of a first IC die of a plurality of IC dies formed on a wafer, the plurality of bond pads including at least a first bond pad and a second bond pad;
forming an under bump metalization layer on the first bond pad and the second bond pad;
forming a first temporary micro-bump that is in electrical contact with a first bond pad through a first opening in a passivation layer formed on a wafer;
forming a second temporary micro-bump that is in electrical contact with a second bond pad through a second opening in the passivation layer;
forming a temporary connection trace coupling the first temporary micro-bump to the second temporary micro-bump;
testing the wafer utilizing signals passing through the temporary connection trace;
removing the first temporary micro-bump, the second temporary micro-bump and the temporary connection trace from the wafer after testing;
forming a first final micro-bump that is in electrical contact with the first bond pad on the wafer; and
forming a second final micro-bump that is in electrical contact with the second bond pad on the wafer.

* * * * *